(12) United States Patent
Petruzzelli et al.

(10) Patent No.: US 12,072,360 B2
(45) Date of Patent: Aug. 27, 2024

(54) MODULAR METER

(71) Applicant: DISH Wireless L.L.C., Englewood, CO (US)

(72) Inventors: Edmund Petruzzelli, Winchester, VA (US); Marcel Guajardo, Lakewood, CO (US)

(73) Assignee: DISH Wireless L.L.C., Englewood, CO (US)

( * ) Notice: Subject to any disclaimer, the term of this patent is extended or adjusted under 35 U.S.C. 154(b) by 123 days.

(21) Appl. No.: 17/018,710

(22) Filed: Sep. 11, 2020

(65) Prior Publication Data

US 2022/0082597 A1    Mar. 17, 2022

(51) Int. Cl.
*G01R 22/10* (2006.01)
*G01R 23/02* (2006.01)

(52) U.S. Cl.
CPC .............. *G01R 22/10* (2013.01); *G01R 23/02* (2013.01)

(58) Field of Classification Search
CPC ........ G01R 22/00; G01R 22/06; G01R 22/10; G01R 23/00; G01R 23/02; G01R 21/133; G01R 22/063; H04B 1/1027; H04B 2001/1054; H04B 2001/1072; H04W 4/00; H04W 4/50
See application file for complete search history.

(56) References Cited

U.S. PATENT DOCUMENTS

| | | | |
|---|---|---|---|
| 9,549,406 B1 * | 1/2017 | Bowers | H04L 1/0026 |
| 2002/0021685 A1 * | 2/2002 | Sakusabe | H04B 7/12 370/343 |
| 2009/0167291 A1 * | 7/2009 | Richeson | G01D 4/004 324/107 |
| 2015/0312891 A1 * | 10/2015 | Quinn | H04W 4/02 455/452.1 |
| 2017/0188366 A1 * | 6/2017 | Zhang | H04W 24/08 |
| 2018/0242334 A1 * | 8/2018 | Kim | H04W 72/0446 |
| 2019/0149181 A1 * | 5/2019 | Tsai | H04B 17/318 370/252 |
| 2022/0255697 A1 * | 8/2022 | Wu | H04W 72/04 |

* cited by examiner

*Primary Examiner* — Son T Le
*Assistant Examiner* — Matthew W. Baca
(74) *Attorney, Agent, or Firm* — Perkins Coie LLP

(57) ABSTRACT

A technique is described for metering signals transmitted from a variety of frequency bands. As an example, receiving, at the software-defined multiband power meter, a first selection of a first modulation scheme corresponding to a first frequency range, configuring the software-defined multiband power meter to accept detection of a first set of one or more signals within the first frequency range, wherein the software-defined multiband power meter is configured to isolate the first set of one or more signals of the first frequency range, detecting the first set of one or more signals within the first frequency range, measuring a first signal quality of the first set of one or more signals, and transmitting one or more data packets identifying at least one signal quality measurement of the first set of one or more signals.

14 Claims, 7 Drawing Sheets

MODULAR METER

BACKGROUND

Presently, content distributors may provide data to users on a variety of frequency bands. For example, a user may receive content from cellular networks, cable networks, or satellite networks. However, to measure the signal quality of signals on the variety of frequency bands, different meters may be used each frequency band.

Figure 1:
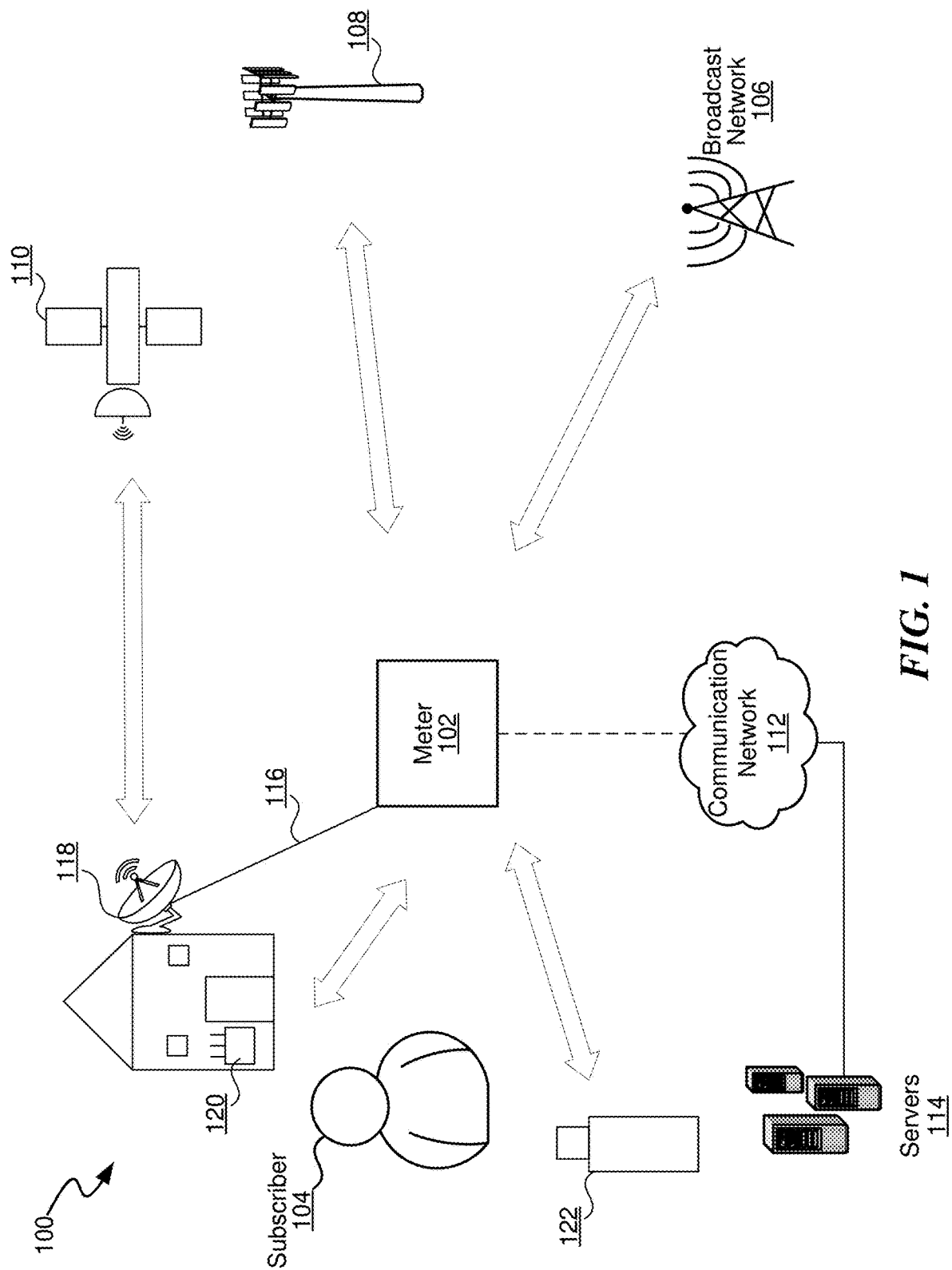
FIG. 1 is a schematic diagram showing a logical system architecture, in accordance with an embodiment.

The techniques introduced here may be better understood by referring to the following Detailed Description in conjunction with the accompanying drawings, in which like reference numerals indicate identical or functionally similar elements. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

A meter may measure parameters, such as the signal quality or power level, of a received transmission from a content distributor. In some cases, a different meter is used to measure parameters of signals in different frequency bands. If a transmission is received on a second frequency band, a second meter may be used to measure paraments of signals in the second frequency band. Another embodiment includes a modular meter (e.g., universal meter) that is functional across a variety of frequency bands. The meter may have multiple modules to measure signal parameters at different frequencies. The modules may be software or hardware and after a frequency range is determined, the associated module may be selected for metering.

In FIG. 1, a schematic diagram illustrates a logical system architecture 100. A meter 102 (e.g., a software-defined multiband power meter) may measure signal parameters, such as the signal quality, strength (e.g., signal-to-noise ratio (SNR)), wavelength, bandwidth, or power level, from one or more transmission sources such as a broadcast network 106 (e.g., ATSC 1.0 or 3.0), a wireless communication network 108 (e.g., fifth generation (5G) communication network), a satellite network 110, a Wi-Fi network 120, or a Bluetooth network 122. The meter 102 may collect measurement data from the incoming transmissions and send the measurement data periodically or incrementally to the communications network 112, where it is stored at the servers 114. In some implementations the meter 102 may measure signal parameters at a location of a subscriber 104. For example, a dish antenna 118 may communicate with the satellite network 110. Dish antenna 118 may connect to meter 102 via a coaxial cable 116, so meter 102 can measure the signal parameters of transmissions from the satellite network 110. Signal measurements may also be taken from a Wi-Fi network device 120 or a Bluetooth network device 122.

In an embodiment, the meter 102 measures parameters of transmissions received on a variety of frequency bands. A user (e.g., installer or technician) may select a module associated with a frequency band to meter signals. In some implementations, the meter 102 may determine the frequency of the received transmission and select a module based on the associated frequency band. In another embodiment, the modules are software (e.g., software defined radio (SDR)) which a user can select or the meter 102 can select and load for metering. In another embodiment, the modules are hardware which user can connect to the meter 102 based on the determined frequency. The meter 102 may perform tuning once the module is selected for the determined frequency band. For example, meter 102 detects a transmission from satellite 110 at 4 GHz. The user may select a module associated with a frequency band that covers that frequency range (e.g., super high frequency (SHF) range of 3 GHZ to 30 GHz). After the user selects the frequency band that covers 4 GHz, the meter 102 may tune the module to 4 GHz to measure the signal quality of the transmission from satellite 110. In an embodiment, meter 102 may be configured to reject detection of signals which are outside of the frequency range of the selected frequency band.

In an embodiment, the meter 102 may tag the measurements with a geolocation (e.g., each measurement is paired to geo-located information, such as a latitude or longitude, street address, subscriber location, or other regional identifier of subscriber 104). The meter 102 may convert the measurements into data packets and transmit the data packets to server 114. In another embodiment, server 114 may identify a geolocation associated with the measurements. The geolocation is associated with a location of subscriber 104. In some implementations, the server may request the geolocation of the measurements from the meter 102.

Figure 2A:
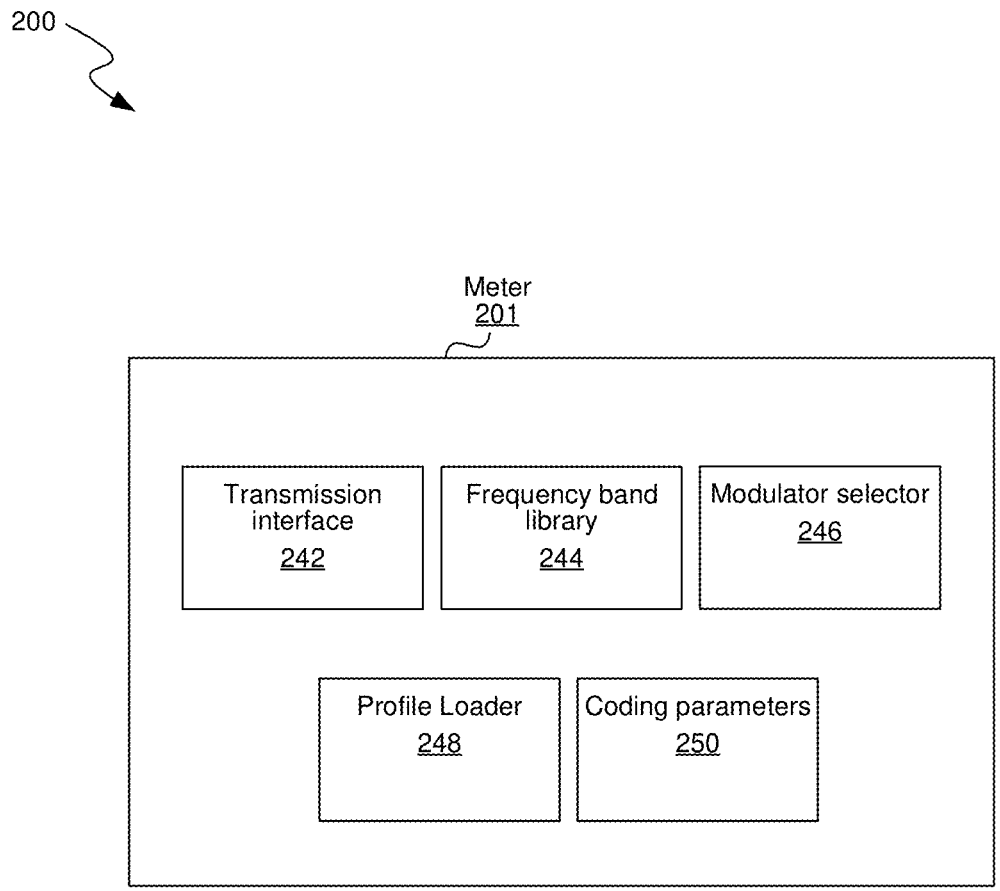
FIG. 2A is a schematic diagram showing the devices of a modular meter, according to an embodiment.

FIG. 2A illustrates an embodiment of components of a modular meter 201 in a system 200. The components can include a transmission interface 242, a frequency band library 244, modulator selector 246, profile loader 248, and a coding parameter 250. Meter 201 may receive a transmission via the transmission interface 242 and determine the frequency associated with the transmission. In an embodiment, meter 201 may receive and transmit signals via multiple input/output ports such as ethernet, F-connectors for coaxial cables, USB-C, micro-USB, etc. In another embodiment, meter 201 has embedded antennas and external antenna ports. The embedded antennas may receive the transmissions on frequency bands from network sources. The external antenna ports may allow for measurements to be taken for a variety of scenarios. One example is convenience for testing in which signal measurements can be taken indoors by connecting to an outdoor, installed antenna. Another example is frequency band compatibility so that measurements can be taken from larger antennas than those embedded in the meter itself in order to better receive lower frequencies.

In an embodiment, meter 201 may select a frequency band from frequency band library 244 with a frequency range that correlates to the determined frequency. For example, meter 201 receives a transmission from a 5G source and determines the frequency of the transmission is 25 GHz. Meter 201 may select a frequency band (e.g., super high frequency band (SHF) with a frequency range of 3-30 GHz) that includes 25 GHz within the frequency range of the frequency band. After selecting the frequency band based on the determined frequency of the transmission, the modulator selector 246 may select a module to measure the signal quality of the transmission. For example, the modulator selector 246 may select a module for measuring the signal quality of signals within the frequency range of 3-30 GHz based on the received signal having a frequency of 25 GHz. In some cases, the selected module may reject the detection of signals outside of the frequency range of 3-30 GHz.

In another embodiment, a user may select the module to measure the signal quality of the transmission. The selection of a module may be made based on factors such as frequency compatibility, pre-assigned data collection parameters, or availability of modules loaded onto the universal meter 201. There may be various modes of operation that dictate module selection. For example, in one mode, the user can designate which specific frequencies to measure through the universal meter interface, and the meter would then select a compatible module. In an alternate mode, a pre-configured or designated setting for specific frequency ranges could be assigned. In another alternate mode, the universal meter could perform a universal frequency scan (e.g. 54 MHz to 7 GHz) and select a compatible module as required. The modular architecture of the universal meter may allow for investing in modules for specific frequencies as required. Thus, a universal meter may possess specific modules in a given operating geographical area to support the local business needs, and so module selection may occur through pre-configured firmware.

Profile loader 248 may load profiles for measuring signal parameters based on the selected module for the determined frequency. For example, profile loader 248 may load a first profile for measuring the signal quality of a signal received at 25 GHz or a second profile for measuring the SNR of the signal received at 25 GHz.

Meter 201 may adjust coding parameters 250 in the selected module to increase accuracy of the measurement. For example, meter 201 may adjust coding parameters 250 to capture multiple measurements of the signal quality of a signal at 25 GHz. In some cases, meter 201 may adjust the coding parameters 250 to switch between measuring different signal parameters, such as signal quality or power level. Meter 201 may adjust the coding parameters 250 to tune to other frequency levels. For example, the received signal is determined to have a frequency of 25 GHz, and meter 201 may adjust the signal parameters 250 to measure signal parameters at 24.25 GHz or 25.4 GHz. Adjusting coding parameters may change the orientation of the antennas receiving the transmission. Reception of signals may vary by transmission and different coding parameters allow the universal meter 201 to analyze the entire bandwidth of the signal. In the 24.25 GHz example above, a signal that spans across the 25 GHz frequency may exhibit different behaviors or errors across its entire channel bandwidth. By taking a detailed view (e.g., microscopic view) of the signal at 24.25 GHz through 25.40 GHz, the universal meter 201 can provide additional information to the user for analysis.

Figure 2B:
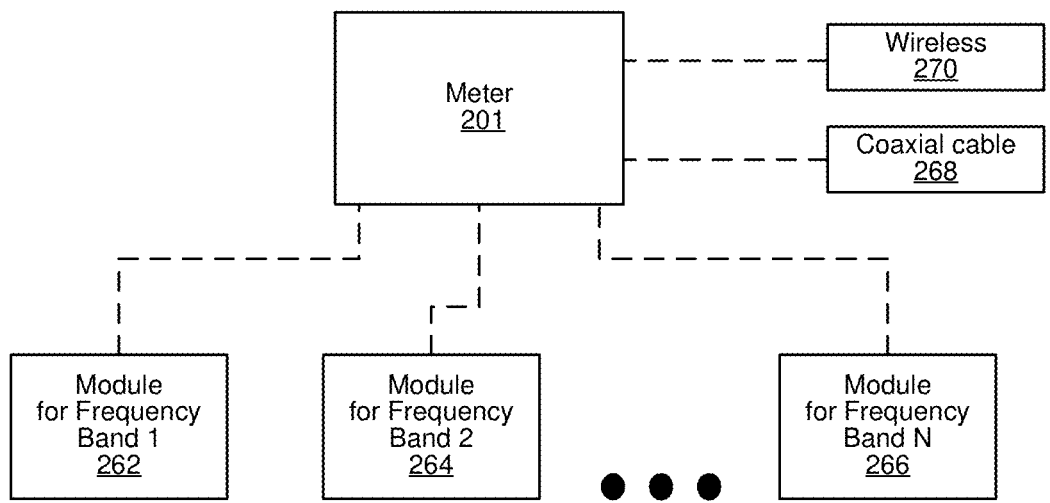
FIG. 2B is a schematic diagram showing the devices of a modular meter, according to an embodiment.

FIG. 2B illustrates an embodiment of meter 201 in a system 260. As shown, meter 201 is operatively connected via wireless or wired connection to module for frequency band 1 262, a module for frequency band 2 264, and a multitude of modules for frequency bands up to a module for frequency band N 266. The frequency bands may range from 3 kHz to 300 GHz and meter 201 may support metering for transmission on every frequency band. In an embodiment, the modules are hardware and connected to meter 201. Meter 201 may be operatively connected via wired connection to inputs from a coaxial cable 268 (e.g., F-connector) or wireless connection to wireless input 270 (e.g., via embedded or external antennas).

Frequency band 1 through frequency band N may be similar to the very low frequency (VLF) band with a frequency range of 3-30 kHz, the low frequency (LF) band with a frequency range of 30-300 kHz, the medium frequency (MF) band with a frequency range of 300-3,000 kHz, the high frequency (HF) band with a frequency range of 3-30 MHz, the very high frequency (VHF) band with a frequency range of 30-300 MHz, the ultra-high frequency (UHF) band with a frequency range of 300-3,000 MHz, the super high frequency (SHF) band with a frequency range of 3-30 GHz, and the extremely high frequency (EHF) band with a frequency range of 30-300 GHz. In an embodiment, the meter 201 may receive a transmission at a frequency of 25 GHz from a 5G source and select a module which may reject detection of signals outside of the frequency range of 24.25 GHz to 52.6 GHz. In another embodiment, meter 201 may receive a transmission at a frequency of 3.8 GHz from a satellite source and select a module which may reject detection of signals outside of the frequency range of 3.7 GHz to 4.2 GHz.

In an embodiment, meter 201 may receive an input from coaxial cable 268, and determine the frequency associated with the input. For example, the determined frequency is 1 GHz which is covered by module for frequency band 2 264. A user may connect meter 201 to module 264 to measure the signal quality of the input from coaxial cable 268.

Figure 2C:
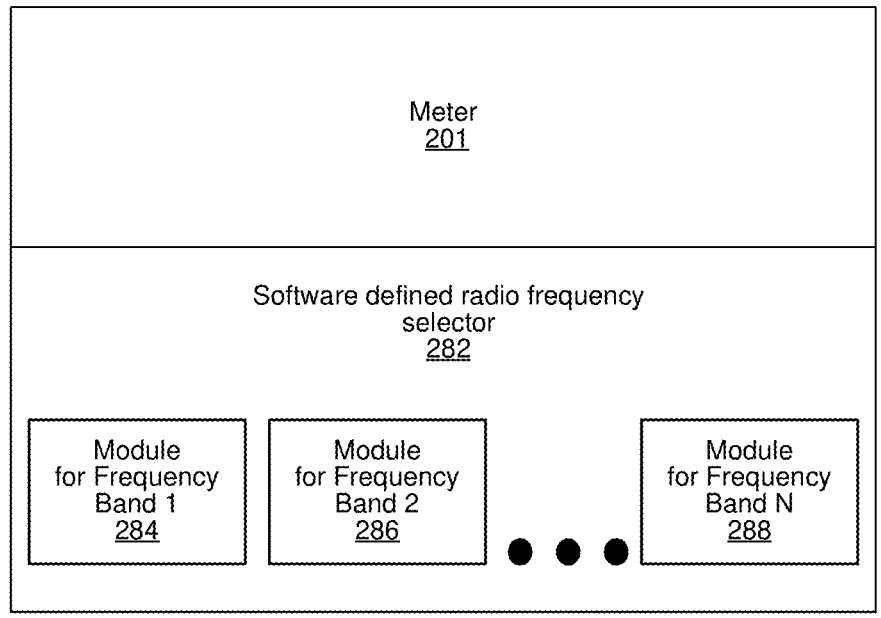
FIG. 2C is a schematic diagram showing the devices of a modular meter, according to an embodiment.

FIG. 2C illustrates an embodiment of meter 201 in a system 280. Meter 201 may contain an SDR frequency selector 282 for a variety of modules for metering frequency bands (e.g., frequency bands with frequency ranges of 3 kHz to 300 GHz) such as module for frequency band 1 284, module for frequency band 2 286, and multitude of modules for frequency bands including module for frequency band N 288.

In an embodiment, meter 201 may receive a transmission and determine the frequency of the transmission. For example, the determined frequency is 450 MHz which is covered by the module for frequency band 1 284. A user may select module 284 and SDR frequency selector 282 may load module 284 to measure the power level of the transmission. Meter 201 may be configured to reject detection of transmissions which are outside of the frequency band 1 covered by the selected module 284. In some implementations, selecting a different module clears out the settings from the previous module. For example, if the determined frequency is 2 GHz which is covered by the module for frequency band 2 286. A user may select module 286 and SDR frequency selector 282 may load module 286 which clears out the settings from module 284.

In an embodiment, a user may attach the meter 201 to an external antenna to receive transmissions at the frequency associated with the antenna. SDR frequency selector 282 may load module 284 to measure the power level of the transmissions received on the external antenna. In another embodiment, the user may select the module for the SDR frequency selector 282 to load. Meter 201 may adjust embedded antennas based on the selected module.

Figure 3:
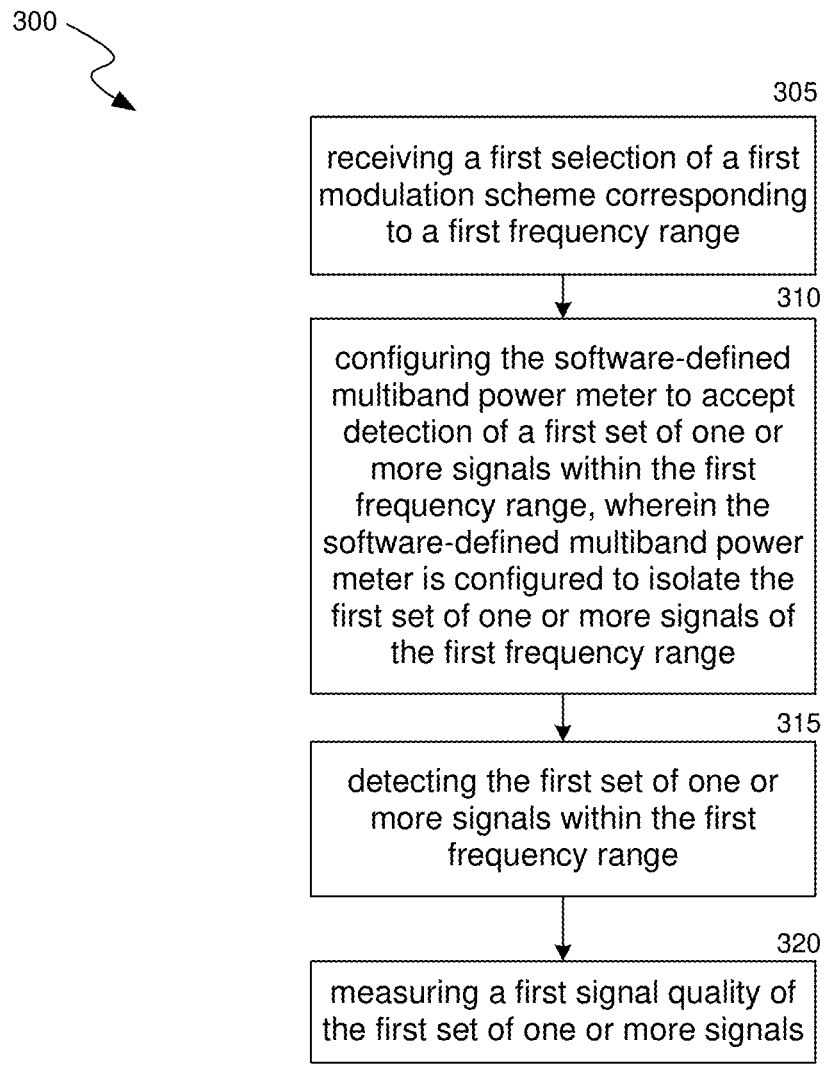
FIG. 3 is a flow diagram of an exemplary process for modular metering, according to an embodiment.

FIG. 3 illustrates an embodiment of process 300 of modular metering. At step 305, a meter (e.g., software-defined multiband power meter) may receive a first selection of a first modulation scheme corresponding to a first frequency range. At step 310, the meter may configure to accept detection of a first set of one or more signals within the first frequency range. In some embodiments, the software-defined multiband power meter is configured to isolate the one or more signals of the first frequency range. For example, the meter may reject detection of one or more signals outside of the first frequency range.

At step 315, the meter may detect the first set of one or more signals within the first frequency range. At step 320, the meter may measure a first signal quality of the first set of one or more signals. In some implementations, the meter may identify a second frequency range corresponding to a second modulation scheme associated with the one or more signals. The meter may adjust parameters to accept detection of one or more signals within the second frequency range. In an embodiment, the meter may determine coding parameters for the second modulation scheme based on the second frequency range and load a modulation profile associated with the second modulation scheme. The meter may switch from the first modulation scheme to the second modulation scheme.

In some implementations, the meter may detect one or more signals within the second frequency range. The meter may measure a signal quality of the one or more signals. In an embodiment, the meter may determine a measurement error of the signal quality using the second modulation scheme and tune coding parameters of the second modulation scheme based on the measurement error.

The meter may convert the signal quality measurement of the one or more signals into data packets and transmit, to a server, the data packets to identifying at least one measurement of the signal quality of the one or more signals.

Figure 4:
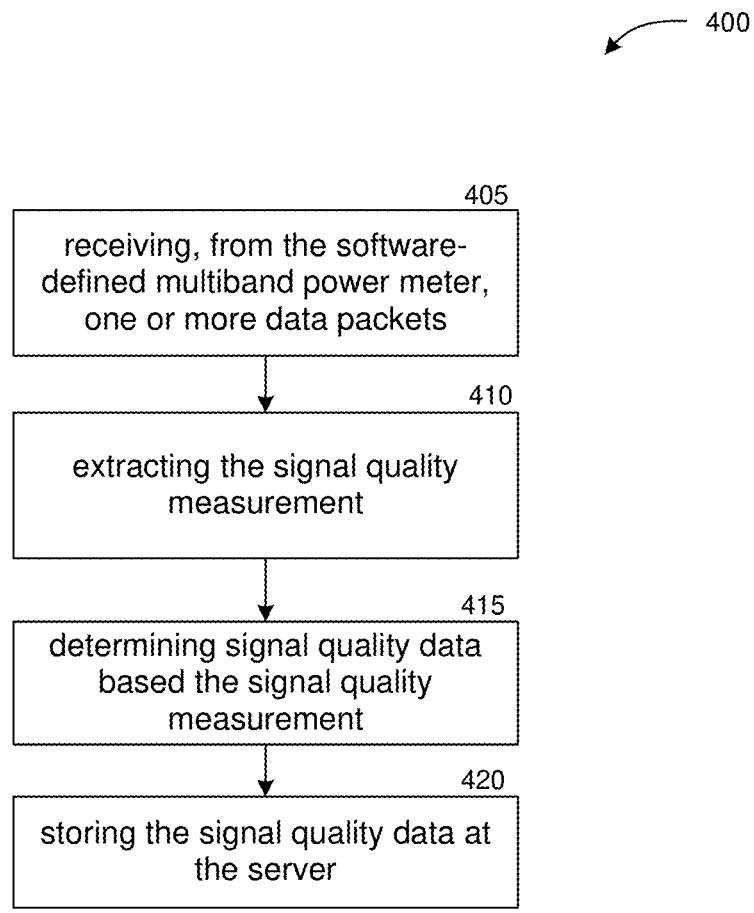
FIG. 4 is a flow diagram of an exemplary process for modular metering, according to an embodiment.

FIG. 4 illustrates an embodiment of process 400 of modular metering. At step, 405, a server may receive, from a meter (e.g., software-defined multiband power meter) one or more data packets and extract the signal quality measurement. At step 410, the server may determine the signal quality data based the signal quality measurement. At step 415, the server may store the signal quality data at the server.

Figure 5:
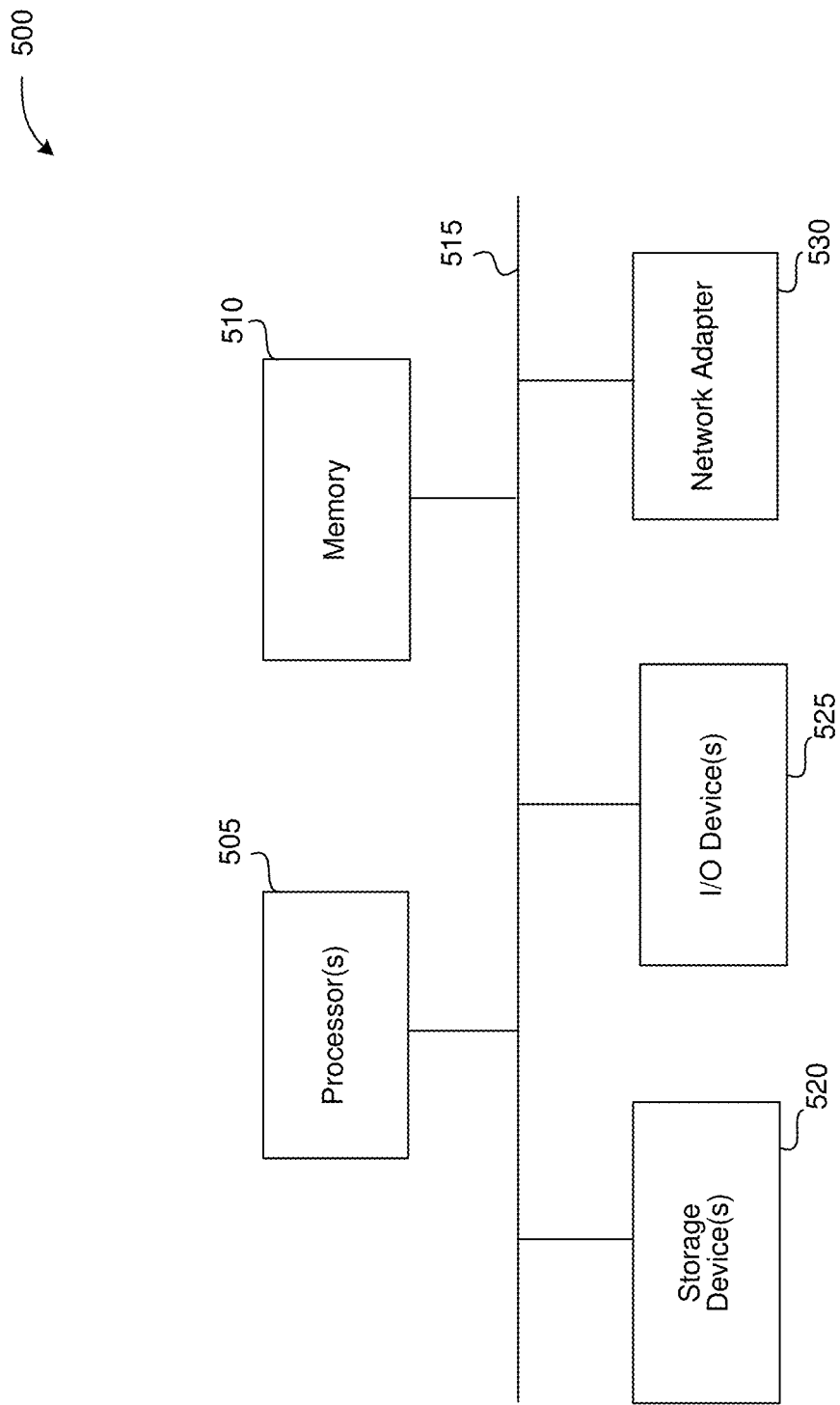
FIG. 5 is a block diagram of a processing system that can implement operations of the disclosed embodiments.

FIG. 5 is a block diagram of a computer system as may be used to implement features of the disclosed embodiments. The computer system 500 may be used to implement any of the entities, components or services depicted in the examples of the foregoing figures (and any other components described in this specification). The computer system 500 may include one or more central processing units ("processors") 505, memory 510, input/output devices 525 (e.g., keyboard and pointing devices, display devices), storage devices 520 (e.g., disk drives), and network adapters 530 (e.g., network interfaces) that are connected to an interconnect 515. The interconnect 515 is illustrated as an abstraction that represents any one or more separate physical buses, point to point connections, or both connected by appropriate bridges, adapters, or controllers. The interconnect 515, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Components (IEEE) standard 1394 bus, also called "Firewire".

The memory 510 and storage devices 520 are computer-readable storage media that may store instructions that implement at least portions of the described embodiments. In addition, the data structures and message structures may be stored or transmitted via a data transmission medium, such as a signal on a communications link. Various communications links may be used, such as the Internet, a local area network, a wide area network, or a point-to-point dial-up connection. Thus, computer readable media can include computer-readable storage media (e.g., "non-transitory" media) and computer-readable transmission media.

The instructions stored in memory 510 can be implemented as software and/or firmware to program the processor(s) 505 to carry out actions described above. In some embodiments, such software or firmware may be initially provided to the computer system 500 by downloading it from a remote system through the computer system 500 (e.g., via network adapter 530).

The embodiments introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Terms that are used to describe the disclosure are discussed below, or elsewhere in the specification, to provide additional guidance to the practitioner regarding the description of the disclosure. For convenience, some terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for some terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Those skilled in the art will appreciate that the logic illustrated in each of the flow diagrams discussed above, may be altered in various ways. For example, the order of the logic may be rearranged, substeps may be performed in parallel, illustrated logic may be omitted; other logic may be included, etc.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

What is claimed is:

1. A system for multiband power measurement within a network environment, the system comprising: a software-defined multiband power meter that includes one or more antennas embedded therein, wherein the software-defined multiband power meter is configured to:
   receive one or more signals within a first frequency range;
   select a first module from a plurality of modules each pre-configured to receive frequencies associated with a designated operating geographic location of the software-defined multiband power meter, wherein the first module is selected to measure signal quality of signals within the first frequency range;
   in response to selecting the first module, load a profile to measure the signal quality of signals within the first frequency range;
   adjust the one or more antennas embedded in the software-defined multiband power meter based on selecting the first module to detect signals within the first frequency range;
   detect a first set of one or more signals within the first frequency range;
   measure, based on the loaded profile, a first signal quality of the first set of one or more signals;
   receive one or more signals within a second frequency range;
   select a second module from the plurality of modules and corresponding to the second frequency range;
   adjust the one or more antennas embedded in the software-defined multiband power meter based on selecting the second module to detect signals within the second frequency range; detect a second set of one or more signals within the second frequency range;
   measure, based on the loaded profile, a second signal quality of the second set of one or more signals;
   receive an attachment of one or more external antennas to the software-defined multiband power meter;
   in response to receiving the attachment, switch from the second module to a third module to detect a third set of one or more signals within a third frequency range via the one or more external antennas, wherein the third module isolates the third frequency range by rejecting one or more signals outside the third frequency range;
   measure, based on the loaded profile, a third signal quality of the third set of one or more signals within the third frequency range; and
   transmit one or more data packets identifying at least one signal quality measurement of the first, second, and third set of one or more signals;
   a server including at least one processor and a memory, the memory storing instructions executable by the at least one processor such that the at least one processor is programmed to:
   receive, from the software-defined multiband power meter, the one or more data packets;
   extract the at least one signal quality measurement of the first and second set of one or more signals;
   determine signal quality data based on the at least one signal quality measurement of the first and second set of one or more signals; and
   store the signal quality data at the server.

2. The system of claim 1, wherein the software-defined multiband power meter is further configured to:
   determine coding parameters for the second module based on the second frequency range;
   load a modulation profile associated with the second module; and
   switch from the first module to the second module.

3. The system of claim 1, wherein the software-defined multiband power meter is further configured to:
   tune coding parameters of the first module based on a measurement error.

4. The system of claim 1, wherein the software-defined multiband power meter is further configured to:
   convert the first and second signal quality measurements of the first and second set of one or more signals into data packets; and
   transmit the data packets to the server.

5. The system of claim 1, wherein the software-defined multiband power meter is further configured to:
   associate a subscriber location with the first signal quality measurement of the first set of one or more signals; and
   transmit the subscriber location in the one or more data packets to the server.

6. The system of claim 1, wherein the server is further configured to:
   associate location information with a location where the first signal quality measurement occurs; and
   determine that the location corresponds to a subscriber location.

7. The system of claim 1, wherein the first frequency range and the second frequency range are associated with distribution protocols selected from a group of protocols consisting of an advanced television system committee (ATSC) protocol, a digital video broadcasting (DVB) protocol, a satellite protocol, and a fifth-generation mobile network protocol.

8. An apparatus for software-defined multiband power metering, comprising:
   a memory;
   one or more processors electronically coupled to the memory and configured for:
   receiving, at a software-defined multiband power meter that includes one or more antennas embedded therein, one or more signals within a first frequency range;
   selecting, by the software-defined multiband power meter, a first module from a plurality of modules each pre-configured to receive frequencies associated with a designated operating geographic location of the software-defined multiband power meter, wherein the first module is selected to measure signal quality of signals within the first frequency range;

in response to selecting the first module, loading, by the software-defined multiband power meter, a profile to measure signal quality of signals within the first frequency range;

adjusting, by the software-defined multiband power meter, the one or more antennas embedded in the software-defined multiband power meter based on selecting the first module to detect signals within the first frequency range;

detecting, by the software-defined multiband power meter, a first set of one or more signals within the first frequency range;

measuring, by the software-defined multiband power meter, a first signal quality of the first set of one or more signals based on the loaded profile;

receiving, by the software-defined multiband power meter, one or more signals within a second frequency range;

selecting, by the software-defined multiband power meter, a second module from the plurality of modules and corresponding to the second frequency range;

adjusting, by the software-defined multiband power meter, the one or more antennas embedded in the software-defined multiband power meter based on selecting the second module to detect signals within the second frequency range;

detecting, by the software-defined multiband power meter, a second set of one or more signals within the second frequency range;

measuring, by the software-defined multiband power meter, a second signal quality of the second set of one or more signals based on the loaded profile;

receiving, by the software-defined multiband power meter, an attachment of one or more external antennas to the software-defined multiband power meter;

in response to receiving the attachment, switching, by the software-defined multiband power meter, from the second module to a third module to detect a third set of one or more signals within a third frequency range via the one or more external antennas, wherein the third module isolates the third frequency range by rejecting one or more signals outside the third frequency range;

measuring, by the software-defined multiband power meter, a third signal quality of the third set of one or more signals within the third frequency range based on the loaded profile; and transmitting, by the software-defined multiband power meter, one or more data packets identifying at least one signal quality measurement of the first, second, and third set of one or more signals.

9. The apparatus of claim 8, wherein the one or more processors are further configured for:
   determining coding parameters for the second module based on the second frequency range;
   loading a modulation profile associated with the second module; and
   switching from the first module to the second module.

10. The apparatus of claim 8, wherein the one or more processors are further configured for:
    tuning coding parameters of the first module based on a measurement error.

11. The apparatus of claim 8, wherein the one or more processors are further configured for:

converting the first and second signal quality measurements of the first and second set of one or more signals into data packets; and
transmitting the data packets to a server.

12. The apparatus of claim 8, wherein the software-defined multiband power meter is further configured for:
    associating a subscriber location with the first signal quality measurement of the first set of one or more signals; and
    transmitting the subscriber location in the one or more data packets to a server.

13. A computer-implemented method for measuring signal strength with a software-defined multiband power meter, the method comprising:
    receiving, at the software-defined multiband power meter that includes one or more antennas embedded therein, one or more signals within a first frequency range;
    selecting, by the software-defined multiband power meter, a first module from a plurality of modules each preconfigured to receive frequencies associated with a designated operating geographic location of the software-defined multiband power meter, wherein the first module is selected to measure signal quality of signals within the first frequency range;
    in response to selecting the first module, loading, by the software-defined multiband power meter, a profile to measure signal quality of signals within the first frequency range
    adjusting, by the software-defined multiband power meter, the one or more antennas embedded in the software-defined multiband power meter based on selecting the first module to detect signals within the first frequency range;
    detecting, by the software-defined multiband power meter, a first set of one or more signals within the first frequency range;
    measuring, by the software-defined multiband power meter, a first signal quality of the first set of one or more signals based on the loaded profile;
    receiving, by the software-defined multiband power meter, one or more signals within a second frequency range;
    selecting, by the software-defined multiband power meter, a second module from the plurality of modules and corresponding to the second frequency range;
    adjusting, by the software-defined multiband power meter, the one or more antennas embedded in the software-defined multiband power meter based on selecting the second module to detect signals within the second frequency range;
    detecting, by the software-defined multiband power meter, a second set of one or more signals within the second frequency range;
    measuring, by the software-defined multiband power meter, a second signal quality of the second set of one or more signals based on the loaded profile;
    receiving, by the software-defined multiband power meter, an attachment of one or more external antennas to the software-defined multiband power meter;
    in response to receiving the attachment, switching, by the software-defined multiband power meter, from the second module to a third module to detect a third set of one or more signals within a third frequency range via the one or more external antennas, wherein the third module isolates the third frequency range by rejecting one or more signals outside the third frequency range;

measuring, by the software-defined multiband power meter, a third signal quality of the third set of one or more signals within the third frequency range based on the loaded profile; and transmitting, by the software-defined multiband power meter, one or more data packets identifying at least one signal quality measurement of the first, second, and third set of one or more signals.

14. The method of claim 13, further comprising:

determining coding parameters for the second module based on the second frequency range;

loading a modulation profile associated with the second module; and switching from the first module to the second module.

* * * * *